United States Patent [19]

Ahlport

[11] 3,887,785

[45] June 3, 1975

[54] TEMPERATURE CONTROLLED HYBRID OVEN

[75] Inventor: Boyce T. Ahlport, Rolling Hills Estates, Calif.

[73] Assignee: The United States of America as represented by the Secretary of the Air Force, Washington, D.C.

[22] Filed: Aug. 29, 1974

[21] Appl. No.: 501,724

[52] U.S. Cl. ................. 219/209; 219/210; 219/543

[51] Int. Cl. ............................................. H05b 1/00

[58] Field of Search ........... 219/209, 210, 510, 543; 357/28, 80; 310/8.9

[56] References Cited

UNITED STATES PATENTS

| | | | |
|---|---|---|---|
| 3,395,265 | 7/1968 | Weir | 219/209 |
| 3,431,392 | 3/1969 | Garland et al. | 291/210 |
| 3,440,407 | 4/1969 | Goltsos et al. | 219/209 U X |
| 3,662,150 | 5/1972 | Hartung | 219/543 X |

*Primary Examiner*—C. L. Albritton
*Attorney, Agent, or Firm*—Henry S. Miller

[57] ABSTRACT

A temperature controlled microcircuit is located on a beryllia substrate supported symmetrically on thermally insulating glass piers. Thin gold strips located on opposite sides of the microcircuit serve as temperature sensors and are connected to temperature control circuits which regulate the flow of current to microresistive heaters. A second non-temperature controlled substrate may be mounted adjacent first substrate.

1 Claim, 1 Drawing Figure

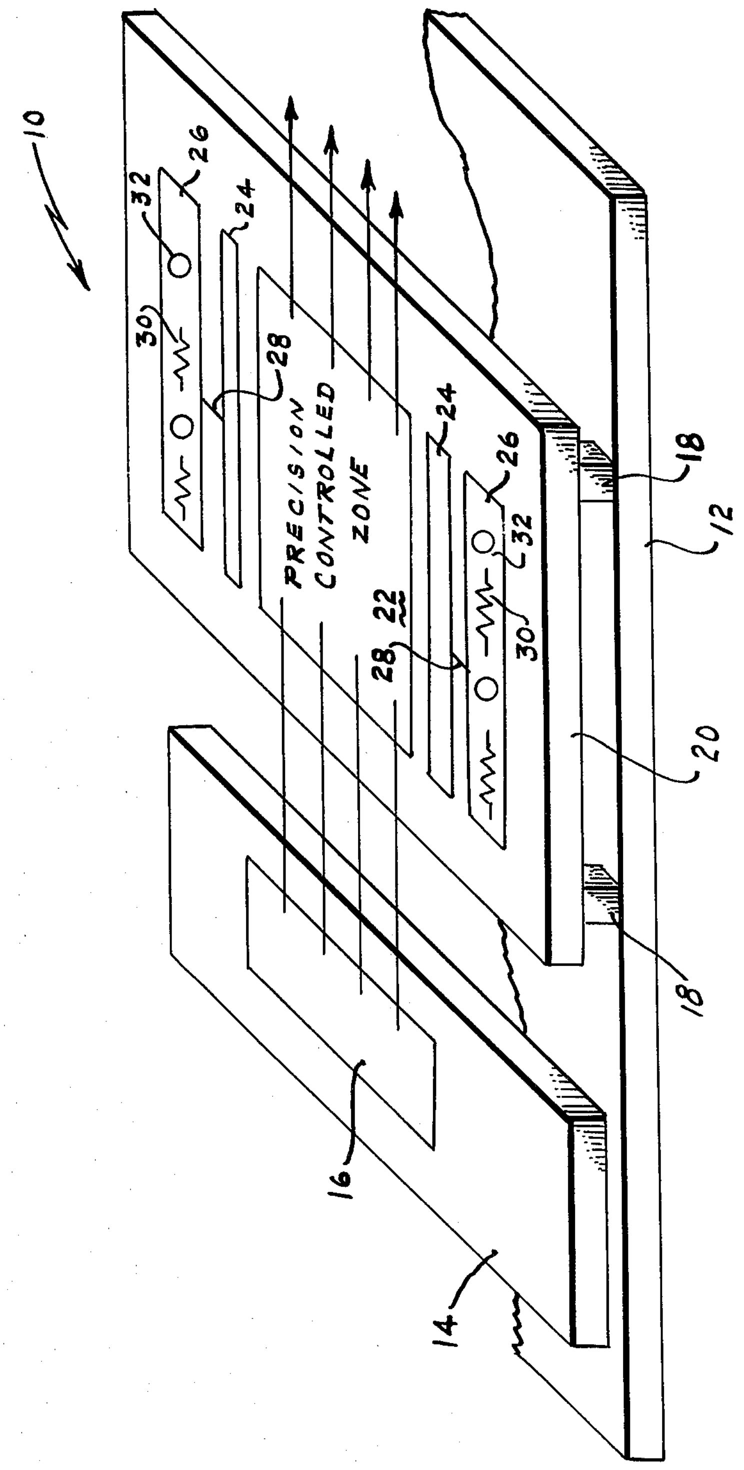
10
PRECISION
CONTROLLED
ZONE
12
14
16
18
18
20
22
24
24
26
26
28
28
30
30
32
32

TEMPERATURE CONTROLLED HYBRID OVEN

BACKGROUND OF THE INVENTION

This invention relates generally to a temperature controlled hybrid oven and more particularly to such a device for insuring precise performance of electronic circuitry.

The temperature dependence of solid-state devices and as a result the circuits they comprise is well known in the art. At times a slight variation in temperature will cause the characteristics of a circuit to be substantially degraded. Although both heat and cold will adversely effect electronic components, the emphasis has shifted from heat to cold with the evolution of solid state devices.

Where circuits are to be utilized in aircraft and space environments there has been justifiable concern about their low temperature performance. One means for compensating for low temperature is by placing the circuit in a miniaturized oven.

With these applications power consumption and size do, of course, become prime factors in final design. It is essential to have the standby power consumption in the oven also minimized. Another consideration in the construction of such an oven is heat dissipation, which may be soaked up by adjacent circuits and cause unwanted effects.

SUMMARY OF THE INVENTION

The invention provides a temperature controlled hybrid oven that avoids the difficulties encountered in similar prior art devices.

Utilizing a substrate having a low thermal impedance and thermally insulated by glass piers from a mounting base, the invention places a temperature dependent circuit on the substrate. Adjacent to the circuit on an unglazed portion of the substrate is a thin film gold metal, disposed so as to become an integral portion of the substrate. The film functions as a substrate temperature sensor. The sensor is connected to an integrated, radiation hardened microcircuit temperature control circuit, utilizing nichrome and silicon transistor chip heaters. Adjacent to the substrate is another substrate with uncritical higher power components which functions in conjunction with the controlled microcircuit.

It is therefore an object of the invention to provide a new and temperature controlled hybrid oven.

It is another object of the invention to provide a new and improved temperature controlled hybrid oven that will allow precise performance of electronic circuitry associated therewith.

It is a further object of the invention to provide a new and improved temperature controlled hybrid oven that has low power consumption.

It is still another object of the invention to provide a new and improved temperature controlled hybrid oven that utilizes an integrated thin film temperature sensor.

It is still a further object of the invention to provide a new and improved temperature controlled hybrid oven that utilizes nichrome and silicon transistor chip heaters.

It is another object of the invention to provide a new and improved temperature controlled hybrid oven that avoids excessive heat dissipation, harmful to other components.

It is another object of the invention to provide a new and improved temperature controlled hybrid oven that is economical to produce and utilizes conventional, currently available components that lend themselves to standard mass production manufacturing techniques.

These and other features and objects of the invention will become more apparent from the following description taken in connection with the illustrative embodiment in the accompanying drawing.

DESCRIPTION OF THE DRAWING

The FIGURE is a schematic representation of the invention.

DESCRIPTION OF THE PREFERRED EMBODIMENT

Referring now to the FIGURE, the invention is shown generally at 10. A Kovar metal base 12 supports the structures and forms part of the enclosure package. A substrate 14 is mounted directly on the base and includes power components 16 which do not require accurately controlled temperature environment.

Supported by symmetrically arranged thermally insulating glass, piers 18 is a beryllia substrate 20 of low thermal impedance characteristics. The microcircuit to be temperature controlled is mounted in a conventional manner in the precision controlled zone 22 on the substrate.

Temperature sensors 24 are formed of a thin gold metal film deposited on an unglazed area of the beryllia substrate. The sensors thereby become integral with the substrate increasing accuracy accordingly. Sensor 24 is connected to the integrated, hardened microcircuit temperature control circuit 26 via line 28. The temperature control circuit utilizes nichrome (30) and silicon transistor (32) chip heaters.

The temperature sensor and control circuit may be glazed in a conventional manner once the circuitry has been deposited. The control circuit is of a conventional nature applying energy to the heaters as the substrate temperature varies according to sensing signals sent from the integral temperature sensing untis.

It should be understood, of course, that the foregoing disclosure relates to only a preferred embodiment of the invention and that numerous modifications or alterations may be made therein without departing from the spirit and scope of the invention as set forth in the appended claims.

What is claimed is:

1. A temperature controlled hybrid oven for microcircuits comprising: a base; a plurality of thermally insulating glass piers positioned symmetrically on said base; a beryllia substrate mounted on said piers; a microcircuit mounted on the substrate; a pair of thin gold films deposited on said substrate adjacent to and opposite sides of said microcircuit for sensing substrate temperature, and means for heating the microcircuit mounted on the substrate, connected to the said films whereby temperature changes in said substrate and microcircuit will be sensed and acted upon by the heating means.

* * * * *